(12) United States Patent
Xu et al.

(10) Patent No.: US 12,237,843 B1
(45) Date of Patent: Feb. 25, 2025

(54) COMPARATOR AND ANALOG-TO-DIGITAL CONVERTER

(71) Applicants: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

(72) Inventors: Daiguo Xu, Chongqing (CN); Hequan Jiang, Chongqing (CN); Ruzhang Li, Chongqing (CN); Jian'an Wang, Chongqing (CN); Guangbing Chen, Chongqing (CN); Dongbing Fu, Chongqing (CN); Yuxin Wang, Chongqing (CN); Shiliu Xu, Chongqing (CN); Zicheng Xu, Chongqing (CN)

(73) Assignees: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

( * ) Notice: Subject to any disclaimer, the term of this patent is extended or adjusted under 35 U.S.C. 154(b) by 162 days.

(21) Appl. No.: 18/020,085

(22) PCT Filed: Aug. 31, 2020

(86) PCT No.: PCT/CN2020/112380
§ 371 (c)(1),
(2) Date: Feb. 7, 2023

(87) PCT Pub. No.: WO2022/027750
PCT Pub. Date: Feb. 10, 2022

(30) Foreign Application Priority Data

Aug. 7, 2020 (CN) .......................... 202010788486.5

(51) Int. Cl.
*H03M 1/38* (2006.01)
*H03K 5/24* (2006.01)
(Continued)

(52) U.S. Cl.
CPC ............ *H03M 1/44* (2013.01); *H03K 5/2481* (2013.01); *H03M 1/002* (2013.01); *H03M 1/125* (2013.01)

(58) Field of Classification Search
CPC ........ H03M 1/44; H03M 1/002; H03M 1/125; H03M 1/12
(Continued)

(56) References Cited

U.S. PATENT DOCUMENTS 5,691,658 A * 11/1997 Klein ........................ H03F 3/72
327/104
2008/0055136 A1* 3/2008 Hesener ................ H03M 1/183
341/144
(Continued)

FOREIGN PATENT DOCUMENTS

CN 101764612 A 6/2010
CN 108712157 A 10/2018
(Continued)

*Primary Examiner* — Peguy Jean Pierre
(74) *Attorney, Agent, or Firm* — IPRTOP LLC

(57) ABSTRACT

The comparator includes an input unit, a load unit, a control switch, and an adjustment unit. The input ends of the input unit are connected to a first input signal and a second input signal. The load unit is connected to the input unit, and the gain of the comparator is adjusted by changing the gate voltages of the pair of gain adjustment transistors of the load unit. The adjustment unit is connected to the input unit, and the gate voltages of the pair of gain adjustment transistors are adjusted according to the enable state of the control switch. The present disclosure also provides an analog-to-digital converter.

9 Claims, 4 Drawing Sheets

(51) Int. Cl.
*H03M 1/00* (2006.01)
*H03M 1/12* (2006.01)
*H03M 1/44* (2006.01)

(58) Field of Classification Search
USPC .................................................. 341/161, 155
See application file for complete search history.

(56) References Cited

U.S. PATENT DOCUMENTS

2016/0204753 A1* 7/2016 Uemura ............... H03G 3/3084
330/278
2019/0035834 A1 1/2019 Kim et al.

FOREIGN PATENT DOCUMENTS

| CN | 110190852 A | 8/2019 |
| CN | 110224701 A | 9/2019 |

* cited by examiner

US 12,237,843 B1

COMPARATOR AND ANALOG-TO-DIGITAL CONVERTER

CROSS REFERENCE TO RELATED APPLICATION

This is a Sect. 371 National Stage of PCT International Application No. PCT/CN2020/112380, filed on Aug. 31, 2020, which claims the benefit of priority to Chinese Patent Application No. CN 202010788486.5, entitled "COMPARATOR AND ANALOG-TO-DIGITAL CONVERTER", filed with CNIPA on Aug. 7, 2020, the disclosure of which is incorporated herein by reference in its entirety.

FIELD OF TECHNOLOGY

The present disclosure relates to the technical field of integrated circuits, in particular, to a comparator and an analog-to-digital converter.

BACKGROUND

In recent years, with the perpetual development of integrated circuit manufacturing technology, the feature size of CMOS devices has been continuously minimized, and the operating voltage of integrated circuits has also been continuously reduced. The operating speed of analog-to-digital converters has been greatly improved by employing the deep sub-micron technique, in this case, the power consumption has been further reduced. However, the performance of the comparator which is the core component of the analog-to-digital converter has become the bottleneck in developing an analog-to-digital converter with high speed and low power. It is difficult for traditional comparator structures to meet the requirements of speed, power consumption, low power supply voltage, and the like simultaneously.

In a case with low precision requirements, a single-stage latch can be used as a comparator. The single-stage latch has advantages of fast speed and low power consumption and disadvantages of noise and large offset. In a case with high precision requirements, a cascaded multi-stage pre-amplifier (Preamp) connected to the latch is typically used as a comparator, to overcome the shortcomings such as high noise and large offset of the single-stage latch structure. Since the pre-amplifier has an offset voltage, when the comparator is applied in the case with high precision requirements, the input differential mode voltage of the comparator may be less than the offset voltage of the comparator, where the input signal of the comparator will be "submerged" by the offset voltage, causing the comparator to output an incorrect comparison result. Therefore, it is necessary to eliminate this offset voltage in practical applications. The traditional elimination technology of the offset voltage of comparator is to add a coupling capacitor between adjacent pre-amplifiers, which has the problems of large power consumption, slow speed, large circuit layout area, and high cost.

SUMMARY

The present disclosure provides a comparator.

The comparator, including an input unit, a load unit, a control switch, and an adjustment unit.

Input ends of the input unit are connected to a first input signal and a second input signal.

The load unit is connected to the input unit, and the load unit includes a pair of gain adjustment transistors, where gate voltages of the pair of gain adjustment transistors are adjusted to change a gain of the comparator.

The adjustment unit is connected to the input unit, and the gate voltages of the pair of gain adjustment transistors are adjusted according to an enable state of the control switch.

In an embodiment, the load unit further includes a pair of first offset transistors and a pair of second offset transistors, where the pair of first offset transistors and the pair of second offset transistors are connected to the input unit in parallel, the pair of first offset transistors include a first transconductance and a first output impedance, and the pair of second offset transistors include a second transconductance and a second output impedance.

The first transconductance and the second transconductance offset each other according to an enable state of the control switch, or the first output impedance and the second output impedance offset each other according to another enable state of the control switch.

In an embodiment, the first input signal includes a first common mode voltage, the second input signal includes a second common mode voltage, the control switch cuts off the connection between the adjustment unit and the pair of gain adjustment transistors, so that the pair of gain adjustment transistors, the pair of first offset transistors, and the pair of second offset transistors are connected in parallel to the input unit, the first transconductance and the second transconductance offset each other, the pair of gain adjustment transistors and the pair of second offset transistors are in a diode connection state, resulting in the comparator in an offset store state.

In an embodiment, the first input signal includes a first differential mode voltage, the second input signal includes a second differential mode voltage, the control switch enables the connection between the adjustment unit and the pair of gain adjustment transistors, so that the first output impedance and the second output impedance offset each other, resulting in the comparator in an amplify state.

In an embodiment, the adjustment unit includes a first transistor, a second transistor, a seventh NMOS transistor, and an eighth NMOS transistor.

A first electrode of the first transistor is connected to a power supply voltage, a second electrode of the first transistor is connected to a first node, and a control electrode of the first transistor is connected to a second node.

A first electrode of the second transistor is connected to the power supply voltage, a second electrode of the second transistor is connected to a third node, and a control electrode of the second transistor is connected to a fourth node.

A source of the seventh NMOS transistor is grounded, a gate of the seventh NMOS transistor is connected to the first node, and a drain of the seventh NMOS transistor is connected to the first node.

A source of the eighth NMOS transistor is grounded, a gate of the eighth NMOS transistor is connected to the third node, and a drain of the eighth NMOS transistor is connected to the third node.

In an embodiment, the pair of gain adjustment transistors include a fifth NMOS transistor and a sixth NMOS transistor.

A source of the fifth NMOS transistor is grounded, a gate of the fifth NMOS transistor is connected to the first node or the second node according to an enable state of the control switch, and a drain of the fifth NMOS transistor is connected to the second node.

A source of the sixth NMOS transistor is grounded, a gate of the sixth NMOS transistor is connected to the third node or the fourth node according to an enable state of the control switch, and a drain of the sixth NMOS transistor is connected to the fourth node.

In an embodiment, the load unit comprises a first NMOS transistor, a second NMOS transistor, a third NMOS transistor, and a fourth NMOS transistor.

A source of the first NMOS transistor is grounded, a gate of the first NMOS transistor is connected to the fourth node, and a drain of the first NMOS transistor is connected to the second node.

A source of the second NMOS transistor is grounded, a gate of the second NMOS transistor is connected to the second node, and a drain of the second NMOS transistor is connected to the fourth node.

A source of the third NMOS transistor is grounded, a gate of the third NMOS transistor is connected to the second node, and a drain of the third NMOS transistor is connected to the second node.

A source of the fourth NMOS transistor is grounded, a gate of the fourth NMOS transistor is connected to the fourth node, and a drain of the fourth NMOS transistor is connected to the fourth node.

In an embodiment, the control switch includes a first switch, a second switch, a third switch, a fourth switch, and a fifth switch.

The first switch in an on state enables the gate of the fifth NMOS transistor to connect to the second node.

The second switch in an on state enables the gate of the fifth NMOS transistor to connect to the first node.

The third switch in an on state enables the gate of the sixth NMOS transistor to connect to the fourth node.

The fourth switch in an on state enables the gate of the sixth NMOS transistor to connect to the third node.

The fifth switch in an on state enables the two output ends of the comparator to be connected to each other.

In an embodiment, the second switch is turned on after the first switch is turned on, the first switch is turned off before the second switch is turned on; the fourth switch is turned on after the third switch is turned on, the third switch is turned off before the fourth switch is turned on; and the fifth switch is turned on after the second switch and the fourth switch are turned on.

In an embodiment, the comparator further includes a constant current source, where the constant current source provides a constant current source current to the comparator.

The input unit includes a third transistor and a fourth transistor, where a first electrode of the third transistor is connected to the constant current source, a second electrode of the third transistor is connected to the second node, and a control electrode of the third transistor is connected to the first input signal; and a first electrode of the fourth transistor is connected to the constant current source, a second electrode of the fourth transistor is connected to the fourth node, and a control electrode of the fourth transistor is connected to the second input signal.

The present disclosure further provides an analog-to-digital converter, which includes the aforementioned comparator according to any one of the embodiments.

As described above, the comparator of the present disclosure has the following beneficial effects:

Through adjusting the gate voltages of the pair of gain adjustment transistors according to the enable state of the control switch, the gain of the comparator in the offset store state can be controlled to be small, and the gain of the comparator in the amplify state can be controlled to be large, which eliminates the influence of the offset voltage of the comparator on the comparison result of the comparator, and improves the speed of the comparator. In addition, the structure of the present disclosure is simple, the layout area is minimized, and the power consumption is decreased, thereby reducing the cost.

REFERENCE NUMERALS

N1—first NMOS transistor;
N2—second NMOS transistor;
N3—third NMOS transistor;
N4—fourth NMOS transistor;
N5—fifth NMOS transistor;
N6—sixth NMOS transistor;
N7—seventh NMOS transistor;
N8—eighth NMOS transistor;
M1—first transistor;
M2—second transistor;
M3—third transistor;
M4—fourth transistor;
K1—first switch;
K2—second switch;
K3—third switch;
K4—fourth switch;
K5—fifth switch;
VDD—operating voltage;
Vip0—first input signal;
Vin0—second input signal;
Vip1—first common mode input signal;
Vin1—second common mode input signal;
Vip2—first differential mode input signal;
Vin2—second differential mode input signal;
Dop—first output signal of the pre-amplifier;
Don—second output signal of the pre-amplifier;
Voutp—first output signal of the comparator;
Voutn—second output signal of the comparator;
a—first node;
b—second node;
c—third node;
d—fourth node;
11—input unit;
12—adjustment unit;
13—load unit;
131—a pair of gain adjustment transistors;
132—a pair of first offset transistors;
133—a pair of second offset transistors;

14—constant current source;
15—latch.

DETAILED DESCRIPTION

Figure 1:
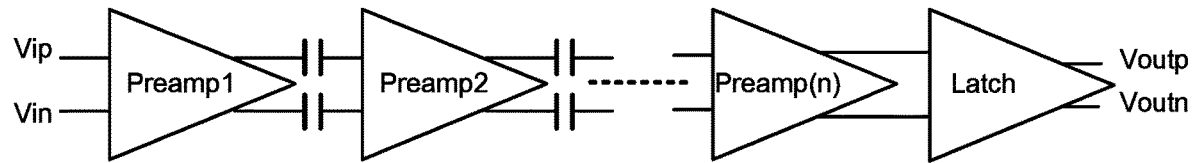
FIG. 1 shows a schematic diagram of a comparator with a cascaded multi-stage pre-amplifier structure.

As described in the background, in a case with high precision requirements, a cascaded multi-stage pre-amplifier (Preamp) connected to the latch is typically used as a comparator, to overcome the shortcomings such as high noise and large offset of the single-stage latch structure. Since the pre-amplifier has an offset voltage, when the comparator is applied in the case with high precision requirements, the input differential mode voltage of the comparator may be less than the offset voltage of the comparator, where the input signal of the comparator will be "submerged" by the offset voltage, causing the comparator to output an incorrect comparison result. Therefore, this offset voltage needs to be eliminated in practical applications. The traditional elimination technology of the offset voltage of the comparator is to add a coupling capacitor between adjacent pre-amplifiers. The schematic diagram of an elimination technology of an offset voltage of a comparator with a cascaded multi-stage pre-amplifier structure is shown in FIG. 1. When the comparator is in a reset state, an input end of a first-stage pre-amplifier (Preamp 1) is connected to a common mode voltage, and the offset voltage of each stage of pre-amplifier (Preamp 1, Preamp 2, . . . , Preamp (n)) is stored in the coupling capacitor between each adjacent stages, thus, the offset voltage can be eliminated when the comparator is in an amplify state. However, the problems of the conventional structure in FIG. 1 are as follows: 1. the gain of each pre-amplifier stage cannot be large to abate the influence of the offset voltage, therefore, under conditions with high-precision requirements, many pre-amplifier stages are required to be connected in series, which increases the power consumption of the comparator. 2. The added coupling capacitor between each adjacent pre-amplifier stages significantly reduces the bandwidth of each pre-amplifier, thereby lowering the speed of the comparator. 3. The multi-stage coupling capacitors cause an obvious increase in the layout area of the circuit and the cost of the circuit.

The embodiments of the present disclosure will be described below through specific examples. Those skilled in the art can easily understand other advantages and effects of the present disclosure according to the contents disclosed by the specification. The present disclosure may also be implemented or applied through other different specific implementation modes. Various modifications or changes may be made to all details in the specification based on different points of view and applications without departing from the spirit of the present disclosure.

It needs to be stated that the drawings provided in the following embodiments are just used for schematically describing the basic concept of the present disclosure, thus only illustrating components related to the present disclosure and are not drawn according to the numbers, shapes, and sizes of components during actual implementation, the configuration, number, and scale of each component during the actual implementation thereof may be freely changed, and the component layout configuration thereof may be more complex. It should be understood that the structures, proportions, sizes, and the like, which are illustrated in the drawings of the present specification, are only used to clarify the contents disclosed in the specification for understanding and reading by those skilled, and are not intended to limit the implementation of the present disclosure, thus are not technically meaningful. Any modification of the structure, change of the scale, or adjustment of the size should still fall within the scope of the technical contents disclosed by the present disclosure without affecting the effects and achievable objectives of the present disclosure.

Embodiment 1

Figure 2:
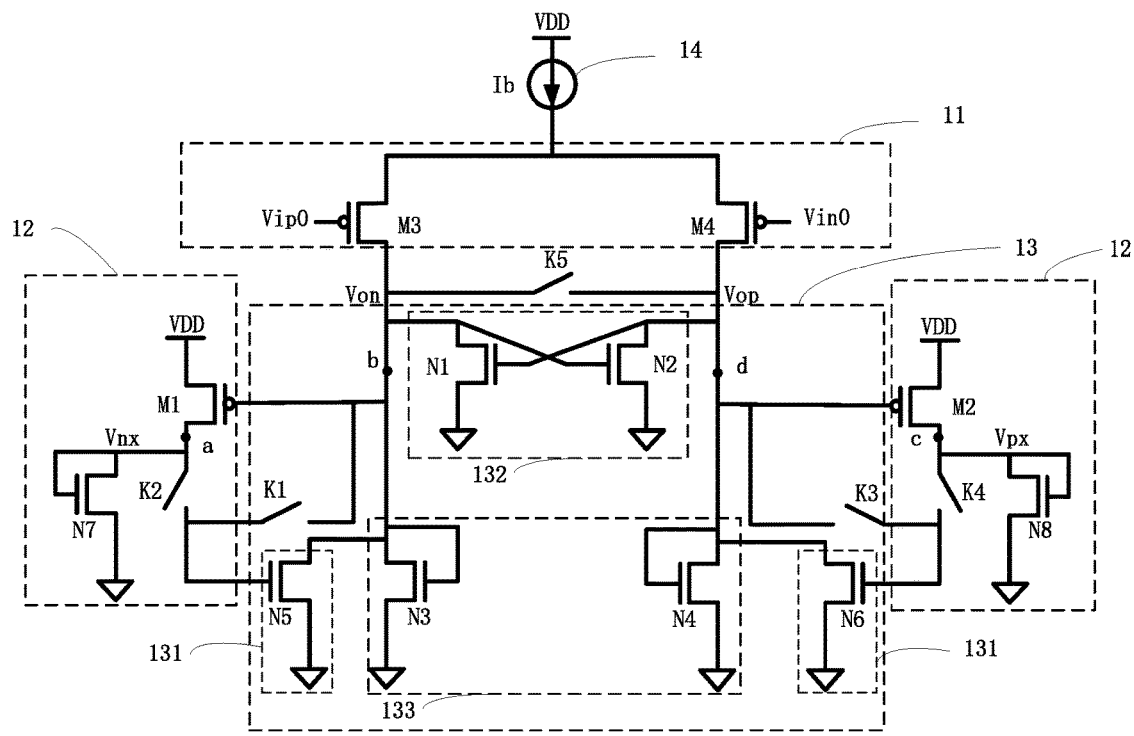
FIG. 2 shows a schematic diagram of an offset elimination technology of a comparator of the present disclosure.

The present disclosure provides a comparator, referring to FIG. 2, which includes an input unit 11, a load unit 13, a control switch, and an adjustment unit 12.

An input end of the input unit 11 is connected to a first input signal Vip0 and a second input signal Vin0.

The load unit 13 is connected to the input unit 11, and the load unit 13 includes a pair of gain adjustment transistors 131, whose gate voltages are adjusted to change a gain of the comparator.

The adjustment unit 12 is connected to the input unit 11, and the gate voltages of the pair of gain adjustment transistors 131 are adjusted according to an enable state of the control switch.

In an embodiment, referring to FIG. 2, the adjusting unit 12 includes a first transistor M1, a second transistor M2, a seventh NMOS transistor N7, and an eighth NMOS transistor N8. A first electrode of the first transistor M1 is connected to a power supply voltage VDD, a second electrode of the first transistor M1 is connected to a first node a, and a control electrode of the first transistor M1 is connected to a second node b. A first electrode of the second transistor M2 is connected to the power supply voltage VDD, a second electrode of the second transistor M2 is connected to a third node c, and a control electrode of the second transistor is connected to a fourth node d. A source of the seventh NMOS transistor is grounded, a gate of the seventh NMOS transistor is connected to the first node a, and a drain of the seventh NMOS transistor is connected to the first node a. A source of the eighth NMOS transistor is grounded, a gate of the eighth NMOS transistor is connected to the third node c, and a drain of the eighth NMOS transistor is connected to the third node c.

In an embodiment, referring to FIG. 2, the pair of gain adjustment transistors 131 include a fifth NMOS transistor N5 and a sixth NMOS transistor N6. A source of the fifth NMOS transistor N5 is grounded, a gate of the fifth NMOS transistor N5 is connected to the first node a or the second node b according to the enable state of the control switch, and a drain of the fifth NMOS transistor N5 is connected to the second node b. A source of the sixth NMOS transistor N6 is grounded, a gate of the sixth NMOS transistor N6 is connected to the third node c or the fourth node d according to the enable state of the control switch, and a drain of the sixth NMOS transistor N6 is connected to the fourth node d.

In an embodiment, referring to FIG. 2, the load unit 13 further includes a pair of first offset transistors 132 and a pair of second offset transistors 133, where the pair of first offset transistors 132 and the pair of second offset transistors 133 are connected to the input unit 11 in parallel, the pair of first offset transistors 132 include a first transconductance and a first output impedance, and the pair of second offset transistors 133 include a second transconductance and a second output impedance. The first transconductance and the second transconductance are offset according to an enable state of the control switch, or the first output impedance and the second output impedance are offset according to an enable state of the control switch.

In an embodiment, referring to FIG. 2, the load unit 13 further includes a pair of first offset transistors 132 and a pair of second offset transistors 133, where the pair of first offset transistors include a first NMOS transistor N1 and a second NMOS transistor N2, and the pair of second offset transistors include a third NMOS transistor N3 and a fourth NMOS transistor N4. A source of the first NMOS transistor N1 is grounded, a gate of the first NMOS transistor N1 is connected to the fourth node d, and a drain of the first NMOS transistor N1 is connected to the second node b; a source of the second NMOS transistor N2 is grounded, a gate of the second NMOS transistor N2 is connected to the second node b, and a drain of the second NMOS transistor N2 is connected to the fourth node d; a source of the third NMOS transistor N3 is grounded, a gate of the third NMOS transistor N3 is connected to the second node b, and a drain of the third NMOS transistor N3 is connected to the second node b; and a source of the fourth NMOS transistor N4 is grounded, a gate of the fourth NMOS transistor N4 is connected to the fourth node d, and a drain of the fourth NMOS transistor N4 is connected to the fourth node d.

In an embodiment, referring to FIG. 2, the comparator further includes a constant current source 14 which provides a current to the comparator. The input unit 11 includes a third transistor M3 and a fourth transistor M4, where a first electrode of the third transistor M3 is connected to the constant current source 14, a second electrode of the third transistor M3 is connected to the second node b, and a control electrode of the third transistor M3 is connected to the first input signal Vip0; and a first electrode of the fourth transistor M4 is connected to the constant current source 14, a second electrode of the fourth transistor M4 is connected to the fourth node d, and a control electrode of the fourth transistor M4 is connected to the second input signal Vin0.

Figure 3:
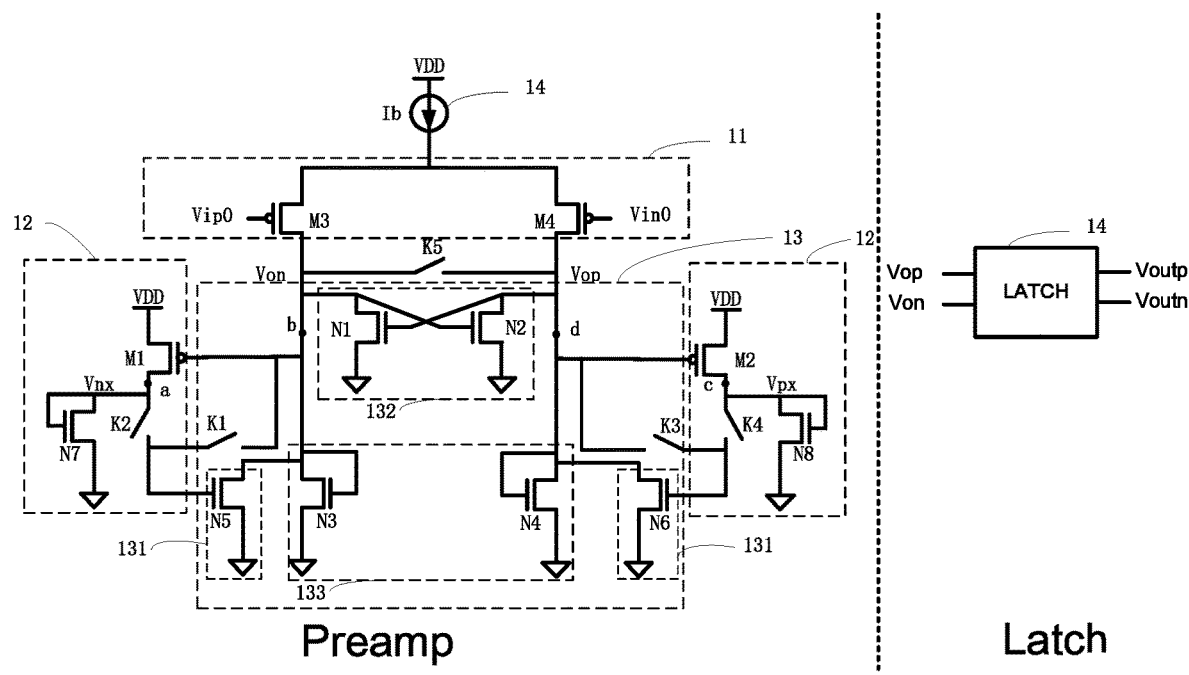
FIG. 3 shows a schematic diagram of another offset elimination technology of a comparator of the present disclosure.

In some embodiments, as shown in FIG. 3, the input unit 11, the load unit 13, the control switch, and the adjustment unit 12 constitute a pre-amplifier stage (Preamp) 14 of the comparator, and the comparator further includes a latch stage 15, where a first output signal Vop of the pre-amplifier stage and a second output signal Von of the pre-amplifier stage are input signals for the latch stage, respectively, and a first output signal Voutp and a second output signal Voutn of the latch stage are output signals for the comparator.

In some embodiments, referring to FIG. 2, the control switch includes a first switch K1, a second switch K2, a third switch K3, a fourth switch K4, and a fifth switch K5.

The first switch K1 in an on state enables the gate of the fifth NMOS transistor N5 to connect to the second node b.

The second switch K2 in an on state enables the gate of the fifth NMOS transistor N5 to connect to the first node a.

The third switch K3 in an on state enables the gate of the sixth NMOS transistor N6 to connect to the fourth node d.

The fourth switch K4 in an on state enables the gate of the sixth NMOS transistor N6 to connect to the third node c.

The fifth switch K5 in an on state enables the two output ends of the comparator to be connected to each other.

The second switch K2 is turned on after the first switch K1 is turned on, the first switch K1 is turned off before the second switch K2 is turned on; the fourth switch K4 is turned on after the third switch K3 is turned on, the third switch K3 is turned off before the fourth switch K4 is turned on; and the fifth switch K5 is turned on after the second switch K2 and the fourth switch K4 are turned on.

Figure 4:
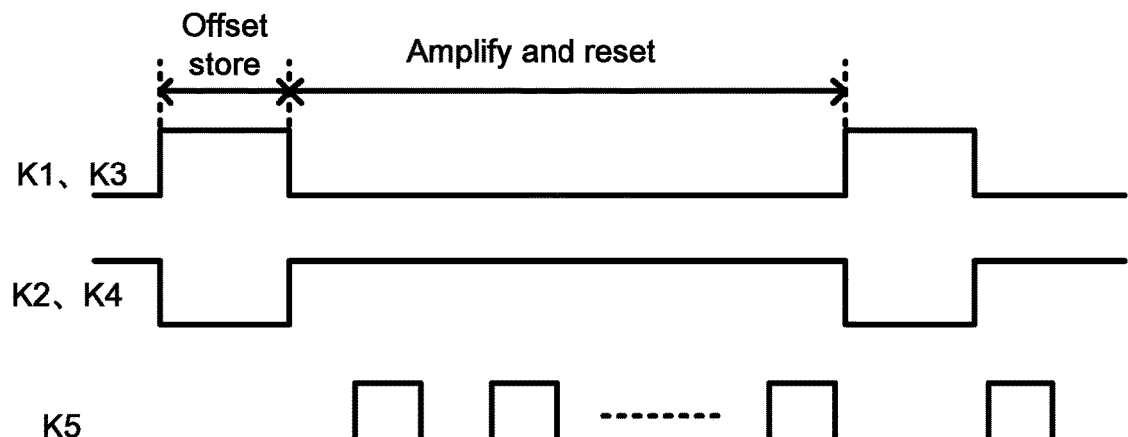
FIG. 4 shows a sequence diagram of an offset elimination technology of a comparator of the present disclosure.

In some embodiments, the operating sequence of the comparator is shown in FIG. 4. The comparator has three working states, which are respectively an offset store state, an amplify state, and a reset state.

In some embodiments, the first input signal includes a first common mode voltage, the second input signal includes a second common mode voltage, the control switch cuts off the connection between the adjustment unit and the pair of gain adjustment transistors, so that the pair of gain adjustment transistors, the pair of first offset transistors, and the pair of second offset transistors are connected in parallel to the input unit, the first transconductance and the second transconductance offset each other, and the pair of gain adjustment transistors and the pair of second offset transistors are in a diode connection state, resulting in the comparator in the offset store state.

Figure 5:
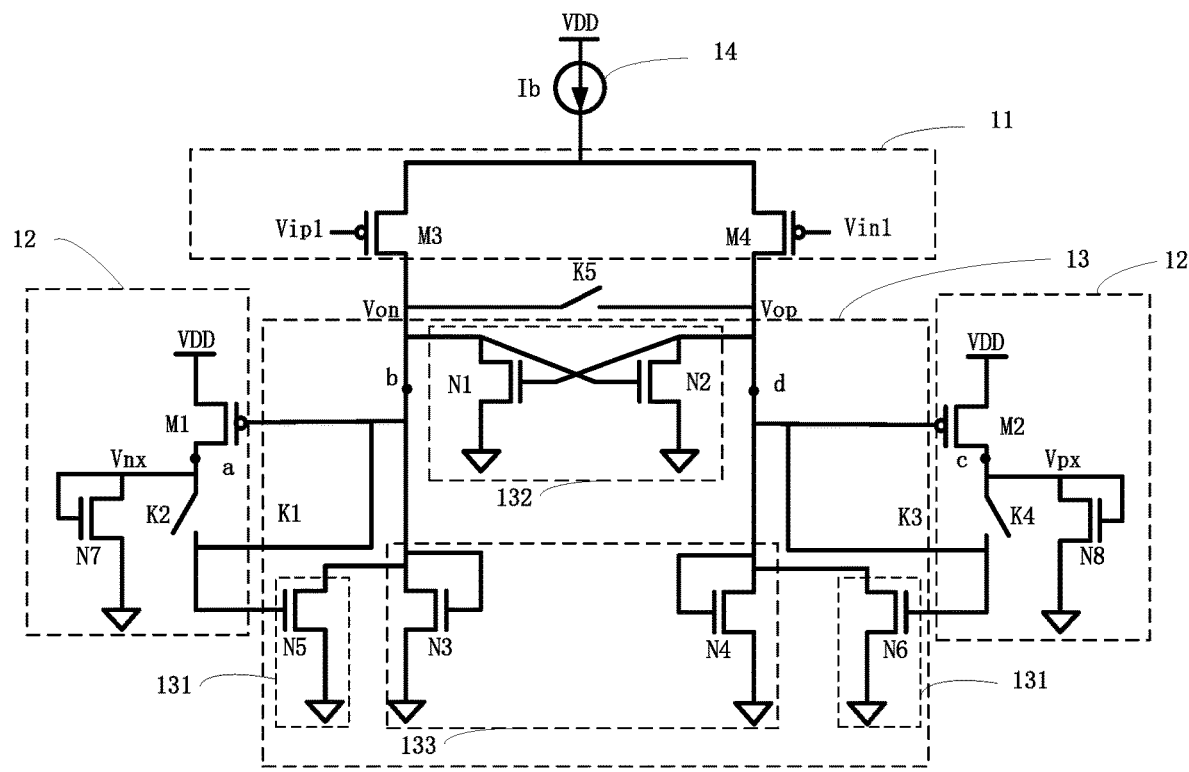
FIG. 5 shows a schematic diagram of an offset store state of a comparator of the present disclosure.

In an embodiment, when the comparator is in the offset store state, the schematic diagram of the comparator is shown in FIG. 5, the switch K2, the switch K4, and the switch K5 are turned off, the switch K1 and the switch K3 are turned on, and the gates of the third transistor M3 and the fourth transistor M4 of the input unit in the comparator are input common mode signals (Vip1 and Vin1). It should be noted that the input common mode signals of the third and fourth transistors should be the same in theory, however, the equivalent input signals of the two ends of the comparator are different in practice due to the offset of the comparator. Therefore, the common mode signals are represented as Vip1 and Vin1, respectively. In this case, the following equations can be obtained according to the KCL current law of the output ends (Von and Vop) of the pre-amplifier stage:

$$g_{m5}Vip1 + \frac{Von}{r_{o3}} + g_{m5}Vop + \frac{Von}{r_{o5}} + (g_{m7} + g_{m9})Von = 0 \quad (1)$$

$$g_{m4}Vin1 + \frac{Vop}{r_{o4}} + g_{m6}Von + \frac{Vop}{r_{o6}} + (g_{m8} + g_{m10})Vop = 0 \quad (2)$$

In the equations, $g_{m3}$ is a transconductance of the third transistor M3, $g_{m4}$ is a transconductance of the fourth transistor M4, $g_{m5}$ is a transconductance of the first NMOS transistor N1, $g_{m6}$ is a transconductance of the second NMOS transistor N2, $g_{m7}$ is a transconductance of the third NMOS transistor N3, $g_{m8}$ is a transconductance of the fourth NMOS transistor N4, $g_{m9}$ is a transconductance of the fifth NMOS transistor N5, $g_{m10}$ is a transconductance of the sixth NMOS transistor N6, $r_{o3}$ is an impedance of the third transistor M3, $r_{o4}$ is an impedance of the fourth transistor M4, $r_{o5}$ is an impedance of the first NMOS transistor N1, and $r_{o6}$ is an impedance of the second NMOS transistor N2.

Due to the symmetry of the circuit, a voltage gain of a small signal of the pre-amplifier stage can be expressed as:

$$A_1 = \frac{g_{m3}}{\frac{1}{r_{o3}} + \frac{1}{r_{o5}} - g_{m5} + g_{m9} + g_{m7}} \quad (3)$$

If N1 and N3, as well as N2 and N4 in FIG. 5, are designed as MOS transistors with the same size, then equation (3) can be simplified as:

$$A_1 = \frac{g_{m3}}{g_{m9}} \quad (4)$$

From equation (4), it can be seen that the gain of the small signal of the pre-amplifier stage is very small.

Moreover, the N3/N5 and N4/N6 transistors of the comparator are in the diode connection state, and the equivalent output impedance is small, therefore, the gain of the comparator is small, and the amplifying multiple of the offset voltage is small.

In some embodiments, the first input signal includes a first differential mode voltage, the second input signal includes a second differential mode voltage, the control switch enables the connection between the adjustment unit and the pair of gain adjustment transistors, so that the first output impedance and the second output impedance offset each other, resulting in the comparator in the amplify state.

Figure 6:
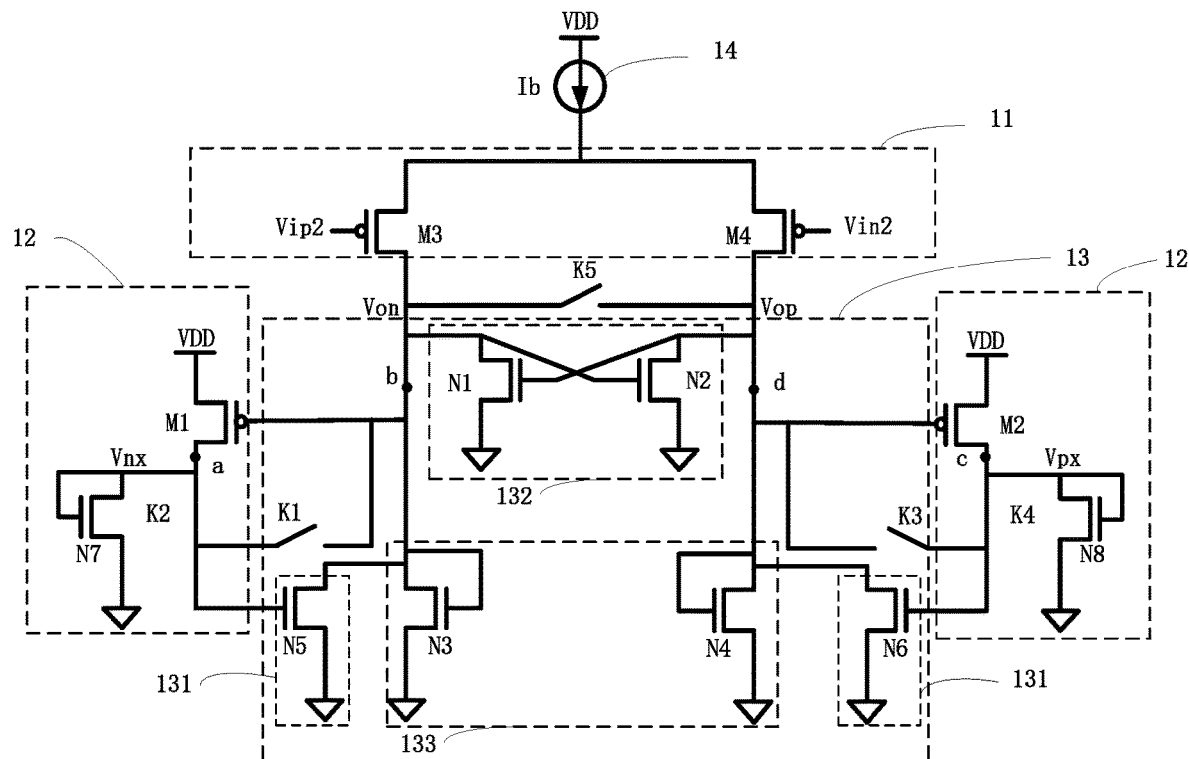
FIG. 6 shows a schematic diagram of an amplify state of a comparator of the present disclosure.

In an embodiment, when the offset store state is finished, the comparator comes into the amplify state schematically shown in FIG. 6, in which the gates of the third transistor M3 and the fourth transistor M4 of the input unit in the comparator are input differential mode signals (Vip2 and Vin2), the switches K2 and K4 are turned on, and the switches K1, K3, and K5 are turned off.

In this case, the following equations can be obtained according to the KCL current law of the output ends (Von and Vop) of the pre-amplifier:

$$g_{m3}Vip2 + \frac{Von}{r_{o3}} + g_{m5}Vop + \frac{Von}{r_{o5}} + \frac{Von}{r_{o9}} + g_{m7}Von + \frac{Von}{r_{o7}} + g_{m9}Vnx = 0 \quad (5)$$

$$g_{m4}Vin2 + \frac{Vop}{r_{o4}} + g_{m6}Von + \frac{Vop}{r_{o6}} + \frac{Vop}{r_{o10}} + g_{m8}Vop + \frac{Vop}{r_{o8}} + g_{m10}Vpx = 0 \quad (6)$$

$$Vnx = -g_{m1}\left(r_{o1} \parallel \frac{1}{g_{m11}}\right) \quad (7)$$

$$Vpx = -g_{m2}\left(r_{o2} \parallel \frac{1}{g_{m12}}\right) \quad (8)$$

The following can be deduced from equation (5) to equation (8):

$$A_2 = \frac{g_{m3}}{\frac{1}{r_{o3}} + \frac{1}{r_{o5}} + \frac{1}{r_{o9}} + \frac{1}{r_{o7}} - g_{m9}} \quad (9)$$

In the equations, $g_{m1}$ is a transconductance of the first transistor M1, $g_{m2}$ is a transconductance of the second transistor M2, m3 is a transconductance of the third transistor M3, $g_{m4}$ is a transconductance of the fourth transistor M4, $g_{m5}$ is a transconductance of the first NMOS transistor N1, $g_{m6}$ is a transconductance of the second NMOS transistor N2, $g_{m7}$ is a transconductance of the third NMOS transistor N3, $g_{m8}$ is a transconductance of the fourth NMOS transistor N4, $g_{m9}$ is a transconductance of the fifth NMOS transistor N5, $g_{m10}$ is a transconductance of the sixth NMOS transistor N6, $g_{m11}$ is a transconductance of the seventh NMOS transistor N7, $g_{m12}$ is a transconductance of the eighth NMOS transistor N8, $r_{o1}$ is an impedance of the first transistor M1, $r_{o2}$ is an impedance of the second transistor M2, $r_{o3}$ is an impedance of the third transistor M3, $r_{o4}$ is an impedance of the fourth transistor M4, $r_{o5}$ is an impedance of the first NMOS transistor N1, $r_{o6}$ is an impedance of the second NMOS transistor N2, $r_{o7}$ is an impedance of the third NMOS transistor N3, $r_{o8}$ is an impedance of the fourth NMOS transistor N4, $r_{o9}$ is an impedance of the fifth NMOS transistor N5, and $r_{o10}$ is an impedance of the sixth NMOS transistor N6.

It can be seen from equation (9) that if the denominator of equation (9) tends to be 0, then the gain of the small signal of the pre-amplifier stage can tend to be infinite, so that the comparator can provide a large gain of small signal in the amplify state. The equivalent output impedances of N2 and N1 are negative and are offset by the equivalent output impedances of N3 and N4 which are in a diode connection mode, respectively, so that the equivalent output impedances of the pre-amplifier stage of the comparator become the equivalent output impedances of N5 and M3 (N6 and M4) which are in a parallel connection. The output impedances of the MOS transistors M3, M4, N5, and N6 are large, because they all operate in a saturation region, therefore, a large output impedance of the pre-amplifier stage can be achieved and then a large voltage gain of the pre-amplifier stage can be realized. Furthermore, the input signals Vip2 and Vin2 of the comparator are significantly amplified.

Afterward, the comparator comes into the reset state, where the switches K5, K4, and K2 are turned on, and the switches K1 and K3 are turned off.

From the above description of the operating states of the comparator, it can be seen that when the comparator is in the offset store state, the amplifying multiple ($A_1$) of the offset voltage ($V_{off}$) is small, and when the comparator is in the amplify state, the amplifying multiple ($A_2$) of the input differential mode signal (Vip2-Vin2) is large. Therefore, under the condition that there exists an offset voltage of the comparator, the output differential mode voltage of the comparator can be expressed as: $A_2*(Vip2-Vin2)-A_1*V_{off}$. Since $A_2$ is much larger than $A_1$, the offset voltage $V_{off}$ of the comparator can be ignored without affecting the comparison result of the comparator.

It should be noted that, in some embodiments, the first transistor, the second transistor, the third transistor, and the fourth transistor may be PMOS transistors or NMOS transistors, and a person skilled in the art may adjust a specific wiring pattern according to whether a PMOS transistor or an NMOS transistor is used.

Figure 7:
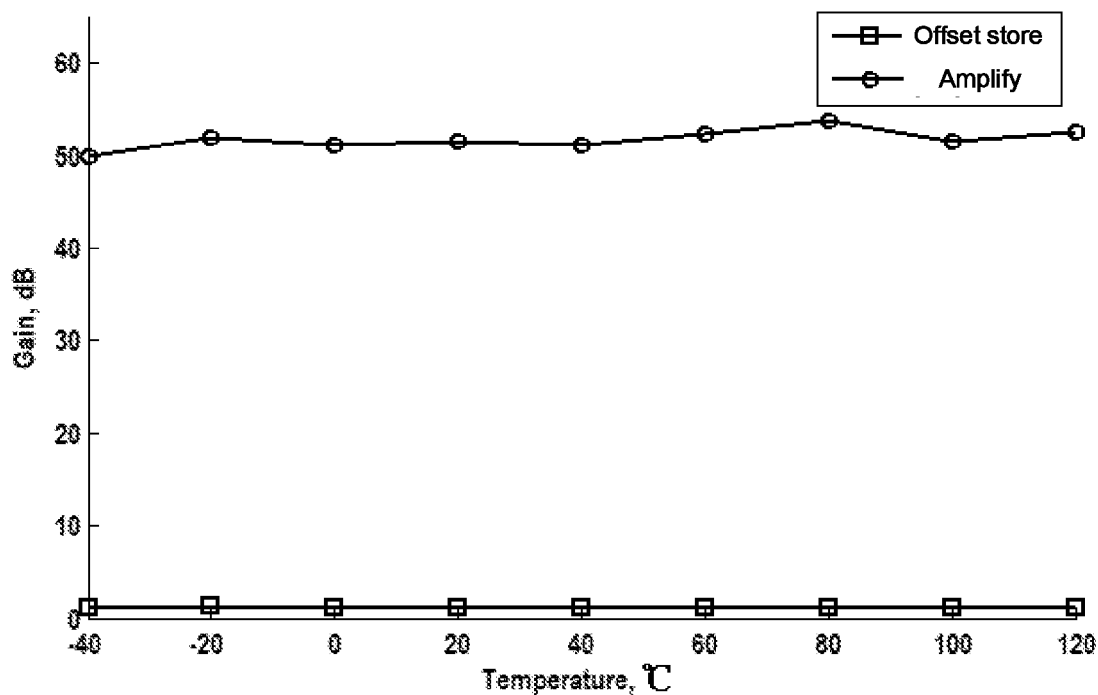
FIG. 7 shows a comparison diagram of gains in the offset store state and the amplify state of the comparator of the present disclosure.
Figure 8:
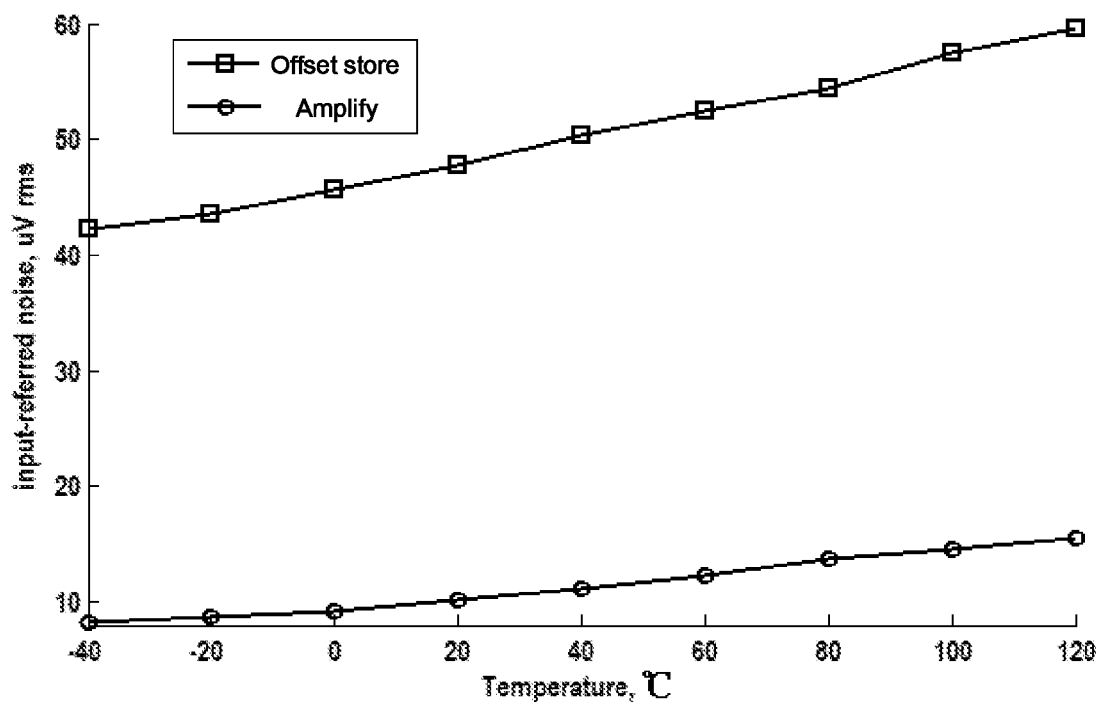
FIG. 8 shows a comparison diagram of equivalent input noises in the offset store state and the amplify state of the comparator of the present disclosure.

In order to further verify the above advantages of the present disclosure, the above structures are carefully designed under a 180 nm CMOS process, where a load capacitor is 10 fF, a clock frequency is 50 MHz, a power supply voltage is 1.8V, and a common mode voltage is 0.9V. When |Voutp-Vouton|=0.9V, it is considered that the comparator completes a comparison. After simulation, a comparison of gains in the offset store state and the amplify state of the comparator of the present disclosure is shown in FIG. 7. It can be seen from FIG. 7 that the gain of the pre-amplifier stage of the comparator is about 1.2 dB in the offset store state and the gain of the pre-amplifier stage of the comparator is about 51 dB in the amplify state. A comparison of equivalent input noises in the offset store state and the amplify state of the comparator of the present disclosure is shown in FIG. 8. When the temperature changes from −40° C. to 120° C., the equivalent input noise of the comparator is in a range of 41 uV rms to 59 uV rms in the offset store state, and the equivalent input noise of the comparator is in a range of 8 uV rms to 15 uV rms in the amplify state. From the simulation results, it can be seen that the offset voltage of the comparator can be significantly suppressed, and the accuracy of the comparator can be significantly improved based on the elimination technology of the offset voltage of the comparator proposed by the present disclosure.

The gain of the comparator with traditional structures is unchanged, the amplifying multiples of the offset voltage of the comparator and the input differential mode voltage of the comparator are the same, and the offset of the comparator is stored by inserting a capacitor between adjacent pre-amplifier (Pre-amp) stages, which seriously reduces the bandwidth of the comparator, affects the speed of the comparator, and significantly increases the layout area of the comparator and the cost of the circuit. The comparator described in an embodiment of the present disclosure provides a small gain when the comparator is in the offset store state, so that the offset voltage of the comparator is amplified by a small multiple, and the comparator provides a large gain when the comparator is in the amplify state, so that the input differential mode signal of the comparator is amplified by a large multiple. Thus, the influence of the offset voltage of the comparator on the comparison result of the comparator is eliminated. The elimination method of the offset of the comparator proposed by the present disclosure improves the speed of the comparator, reduces the layout area, and obviously eliminates the offset voltage of the comparator.

The present disclosure further provides an analog-to-digital converter which includes the above-mentioned comparator. The operation efficiency of the analog-to-digital converter is improved by the fast and accurate comparison of the comparator. In an embodiment, the analog-to-digital converter includes the comparator according to any one of the above embodiments. Reference about specific structure of the analog-to-digital converter may be made to the prior art, therefore, details will not be described herein.

In summary, the comparator provided by the present disclosure includes an input unit, a load unit, a control switch, and an adjustment unit, where the input ends of the input unit are connected to a first input signal and a second input signal; the load unit is connected to the input unit, and the gain of the comparator is adjusted by changing the gate voltage of the gain adjustment pair transistors of the load unit; the adjustment unit is connected to the input unit, and the enable state of the control switch adjusts the gate voltage of the gain adjustment pair transistors. The present disclosure also provides the analog-to-digital converter. The gain of the comparator is small in the offset store state, so that the offset voltage of the comparator is amplified by a small multiple, and the gain of the comparator is large in the signal amplify state, so that the input differential mode signal of the comparator is amplified by a large multiple, which eliminates the influence of the offset voltage the comparator on the comparison result of the comparator, improves the speed of the comparator, and reduces the layout area.

The above-mentioned embodiments are just used to exemplarily describe the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A comparator, comprising
   an input unit, a load unit, a control switch, and an adjustment unit, wherein
   input ends of the input unit are connected to a first input signal and a second input signal;
   the load unit is connected to the input unit, and the load unit comprises a pair of gain adjustment transistors, wherein gate voltages of the pair of gain adjustment transistors are adjusted to change a gain of the comparator; and
   the adjustment unit is connected to the input unit, and the gate voltages of the pair of gain adjustment transistors are adjusted according to an enable state of the control switch;
   wherein the load unit further comprises a pair of first offset transistors and a pair of second offset transistors, and the pair of first offset transistors and the pair of second offset transistors are connected to the input unit in parallel;
   wherein the pair of first offset transistors comprise a first transconductance and a first output impedance, and the pair of second offset transistors comprise a second transconductance and a second output impedance;
   wherein the first transconductance and the second transconductance offset each other according to the enable state of the control switch, or the first output impedance and the second output impedance offset each other according to the enable state of the control switch.

2. The comparator according to claim 1, wherein the first input signal comprises a first common mode voltage, the second input signal comprises a second common mode voltage, the control switch cuts off the connection between the adjustment unit and the pair of gain adjustment transistors, so that the pair of gain adjustment transistors, the pair of first offset transistors, and the pair of second offset transistors are connected in parallel to the input unit, the first transconductance and the second transconductance offset each other, and the pair of gain adjustment transistors and the pair of second offset transistors are in a diode connection state, enabling the comparator in an offset store state.

3. The comparator according to claim 1, wherein the first input signal comprises a first differential mode voltage, the second input signal comprises a second differential mode voltage, the control switch enables the connection between the adjustment unit and the pair of gain adjustment transistors, so that the first output impedance and the second output impedance offset each other, enabling the comparator in an amplify state.

4. The comparator according to claim 1, wherein the adjusting unit comprises a first transistor, a second transistor, a seventh NMOS transistor, and an eighth NMOS transistor, wherein
   a first electrode of the first transistor is connected to a power supply voltage, a second electrode of the first transistor is connected to a first node, and a control electrode of the first transistor is connected to a second node;
   a first electrode of the second transistor is connected to the power supply voltage, a second electrode of the second transistor is connected to a third node, and a control electrode of the second transistor is connected to a fourth node;
   a source of the seventh NMOS transistor is grounded, a gate of the seventh NMOS transistor is connected to the first node, and a drain of the seventh NMOS transistor is connected to the first node; and
   a source of the eighth NMOS transistor is grounded, a gate of the eighth NMOS transistor is connected to the third node, and a drain of the eighth NMOS transistor is connected to the third node.

5. The comparator according to claim 4, wherein the pair of gain adjustment transistors comprise a fifth NMOS transistor and a sixth NMOS transistor, wherein
   a source of the fifth NMOS transistor is grounded, a gate of the fifth NMOS transistor is connected to the first node or the second node according to an enable state of the control switch, and a drain of the fifth NMOS transistor is connected to the second node; and
   a source of the sixth NMOS transistor is grounded, a gate of the sixth NMOS transistor is connected to the third node or the fourth node according to an enable state of the control switch, and a drain of the sixth NMOS transistor is connected to the fourth node.

6. The comparator according to claim 5, wherein the load unit comprises a first NMOS transistor, a second NMOS transistor, a third NMOS transistor, and a fourth NMOS transistor, wherein
   a source of the first NMOS transistor is grounded, a gate of the first NMOS transistor is connected to the fourth node, and a drain of the first NMOS transistor is connected to the second node;
   a source of the second NMOS transistor is grounded, a gate of the second NMOS transistor is connected to the second node, and a drain of the second NMOS transistor is connected to the fourth node;
   a source of the third NMOS transistor is grounded, a gate of the third NMOS transistor is connected to the second node, and a drain of the third NMOS transistor is connected to the second node; and
   a source of the fourth NMOS transistor is grounded, a gate of the fourth NMOS transistor is connected to the fourth node, and a drain of the fourth NMOS transistor is connected to the fourth node.

7. The comparator according to claim 6, wherein the control switch includes a first switch, a second switch, a third switch, a fourth switch, and a fifth switch; wherein
   the first switch in an on state enables the gate of the fifth NMOS transistor to connect to the second node;
   the second switch in an on state enables the gate of the fifth NMOS transistor to connect to the first node;
   the third switch in an on state enables the gate of the sixth NMOS transistor to connect to the fourth node;
   the fourth switch in an on state enables the gate of the sixth NMOS transistor to connect to the third node; and
   the fifth switch in an on state enables the two output ends of the comparator to be connected to each other, and wherein
   the second switch is turned on after the first switch is turned on, the first switch is turned off before the second switch is turned on; the fourth switch is turned on after the third switch is turned on, the third switch is turned off before the fourth switch is turned on; and the fifth switch is turned on after the second switch and the fourth switch are turned on.

8. The comparator according to claim 4, wherein the comparator further comprises a constant current source which provides a constant current source current to the comparator, and the input unit comprises a third transistor and a fourth transistor, wherein
   a first electrode of the third transistor is connected to the constant current source, a second electrode of the third transistor is connected to the second node, and a control electrode of the third transistor is connected to the first input signal; and
   a first electrode of the fourth transistor is connected to the constant current source, a second electrode of the fourth transistor is connected to the fourth node, and a control electrode of the fourth transistor is connected to the second input signal.

9. An analog-to-digital converter, comprising the comparator according to claim 1.

* * * * *